(12) United States Patent
Zou et al.

(10) Patent No.: US 10,840,866 B2
(45) Date of Patent: Nov. 17, 2020

(54) AMPLIFIER CIRCUIT ARRANGEMENT AND METHOD TO CALIBRATE THE SAME

(71) Applicant: TDK Corporation, Tokyo (JP)

(72) Inventors: Lei Zou, København (DK); Pia Sho Garbarsch, Haslev (DK)

(73) Assignee: TDK CORPORATION, Tokyo (JP)

( * ) Notice: Subject to any disclaimer, the term of this patent is extended or adjusted under 35 U.S.C. 154(b) by 73 days.

(21) Appl. No.: 16/355,353

(22) Filed: Mar. 15, 2019

(65) Prior Publication Data
US 2019/0288655 A1  Sep. 19, 2019

(30) Foreign Application Priority Data
Mar. 15, 2018  (DE) .................. 10 2018 106 071

(51) Int. Cl.
*H03F 3/45* (2006.01)
(52) U.S. Cl.
CPC ..... *H03F 3/45475* (2013.01); *H03F 2200/03* (2013.01); *H03F 2200/129* (2013.01); *H03F 2200/165* (2013.01); *H03F 2200/375* (2013.01); *H03F 2203/45048* (2013.01); *H03F 2203/45116* (2013.01)

(58) Field of Classification Search
CPC ...................................... H03F 3/454
See application file for complete search history.

(56) References Cited

U.S. PATENT DOCUMENTS

| | | |
|---|---|---|
| 6,803,555 B1 | 10/2004 | Parrish et al. |
| 7,295,061 B1 | 11/2007 | Dasgupta |
| 9,256,234 B2 * | 2/2016 | Kay .......................... H03F 1/26 |
| 9,825,645 B1 * | 11/2017 | Gaggl ................. H03M 1/0624 |
| 2008/0157846 A1 | 7/2008 | Liu et al. |
| 2008/0315948 A1 * | 12/2008 | Pyykonen ............. H03F 3/2173 330/251 |

(Continued)

FOREIGN PATENT DOCUMENTS

DE   102006045184 A1   4/2008

OTHER PUBLICATIONS

Witte, J.F. et al., "A CMOS Chopper Offset-Stabilized Opamp," IEEE Journal of Solid-State Circuits, vol. 42, No. 7, Jul. 2007, 7 pages.

(Continued)

*Primary Examiner* — Patricia T Nguyen
(74) *Attorney, Agent, or Firm* — Slater Matsil, LLP

(57) ABSTRACT

An amplifier circuit arrangement and a method for calibrating the same. In an embodiment an amplifier circuit arrangement includes a desired signal path including a differential amplifier for an analog signal having an input side and an output side and an analog-to-digital converter having an output terminal, a first feedback path to calibrate an offset of the desired signal path coupled to differential signal lines at the output side of the differential amplifier and to differential signal lines at the input side of the differential amplifier, the first feedback path including a comparator and at least one counter controlled by an output of the comparator and a second feedback path to calibrate a drift of the desired signal path coupled to the output terminal of the analog-to-digital converter and to the differential signal lines at the input side of the differential amplifier, the second feedback path including an average filter.

14 Claims, 3 Drawing Sheets

(56) References Cited

U.S. PATENT DOCUMENTS

| | | | |
|---|---|---|---|
| 2009/0079607 A1* | 3/2009 | Denison | A61B 5/7203 |
| | | | 341/143 |
| 2010/0156534 A1* | 6/2010 | Kim | H03F 3/45475 |
| | | | 330/254 |
| 2015/0180430 A1* | 6/2015 | Wang | H03F 3/217 |
| | | | 381/120 |
| 2016/0087595 A1* | 3/2016 | Gopalraju | H02M 3/158 |
| | | | 323/271 |
| 2019/0079146 A1* | 3/2019 | Romero | H03M 1/00 |

OTHER PUBLICATIONS

Zou, L., "A Resistive Sensing and Dual-slope ADC Based Smart Temperature Sensor," Analog Integrated Circuits and Signal Processing, vol. 87, Issue 1, Apr. 2016, 7 pages.

Zou, L. et al., "Fully Integrated Triple-Mode Sigma-Delta Modulator for Speech Codec," 2016 IEEE Nordic Circuits and Systems Conference (NORCAS), NORCHIP and International Symposium of System-on-Chip (SoC), Nov. 2016, 4 pages.

\* cited by examiner

AMPLIFIER CIRCUIT ARRANGEMENT AND METHOD TO CALIBRATE THE SAME

CROSS-REFERENCE TO RELATED APPLICATIONS

This application claims the benefit of German patent application 102018106071.8, filed on Mar. 15, 2018, which application is hereby incorporated herein by reference.

TECHNICAL FIELD

The present disclosure relates to an amplifier circuit arrangement. Specifically, the present disclosure relates to an amplifier circuit arrangement that comprises a differential amplifier and an analog-to-digital converter and circuitry to calibrate the wanted signal path. The present disclosure furthermore relates to a method to calibrate the amplifier circuit arrangement.

BACKGROUND

Differential amplifiers are widely used in audio signal processing to refresh or increase the amplitude of the wanted signal that is established as the difference of a pair of positive and negative signal portions. One exemplary application of an audio signal amplifier is in the field of microphones where the signal obtained from a micro-electromechanical system (MEMS) audio sensor is amplified and converted from the analog to the digital domain so that it can be further processed with a digital signal processor. The audio amplifier may inherently have a time-invariant offset and a time-variant drift of its output signal that introduces an undesired error to the wanted signal path.

The offset is a time-invariant DC voltage error that is mainly caused by manufacturing variations. For example, a mismatch of the components in the differential processing paths of the differential amplifier may cause an offset in the output signal. In current CMOS manufacturing technology, the offset at the input stage of the amplifier can be in the order of 5 mV to 50 mV. The input offset amplified by the amplification factor of the amplifier causes a considerably large offset in the differential output signal of the amplifier.

The drift is a time-variant voltage error that is caused by error sources that often change with temperature or time. One major error source is the flicker noise caused by the defects in the interface between the gate oxide and the silicon substrate of the transistors fabricated in CMOS manufacturing technology. Other drift error sources are also possible, such as noise from the supply voltage or the temperature dependency of bias currents. The drift error is usually a low frequency error in the range of 0 Hz up to about 20 Hz so that the drift leads to a low frequency time-variant voltage variation at the output of the differential amplifier. The drift has a non-zero average DC voltage.

The common mode output voltage of a differential amplifier is normally set to half of the supply voltage (VDD), that is VDD/2. Due to offset and drift, the common mode output voltage of the differential amplifier can be different from VDD/2 so that it is closer either to ground or the supply voltage VDD. This reduces the dynamic range of the signal to be processed, and the wanted signal at the output of the differential amplifier can reach saturation so that it clips or sticks to ground potential or the supply voltage when a large signal amplitude is provided at the output of the differential amplifier. In this case, the signal information is lost.

Accordingly, there is a need to calibrate a differential amplifier to compensate offset and drift so that the common mode output voltage of the amplifier is close to the desired value of VDD/2. Conventional calibration methods involve a calibration of the amplifier by measuring and trimming the amplifier circuit during the manufacturing process. This will usually not take into account any time-variant drift effects.

SUMMARY

Embodiments provide a differential amplifier circuit arrangement of which the common mode output voltage is closer to the desired level.

Further embodiments provide a differential amplifier circuit arrangement that can be calibrated for time-invariant offset errors and time-variant drift errors.

Other embodiments provide a method for calibrating a differential amplifier circuit arrangement of which the common mode output voltage is closer to the desired level.

Yet other embodiments provide a method for calibrating a differential amplifier circuit arrangement for time-invariant offset errors and the time-variant drift errors.

In an embodiment, an amplifier circuit arrangement of the present disclosure comprises a wanted signal path that includes a differential amplifier for a differential analog signal and an analog-to-digital converter (ADC) connected downstream of the differential amplifier. The differential amplifier processes positive and negative signal portions on corresponding positive and negative signal lines wherein the wanted signal is included in the difference of the positive and negative signals. The differential amplifier may have a fixed gain or a variable gain. The ADC in the wanted signal path is often a sigma-delta-modulator or a sigma-delta-converter that generates a digital bit stream from the amplified differential analog signal. An anti-aliasing (AAS) filter coupled to the output of the amplifier confines the analog signal bandwidth to avoid frequency spectrum aliasing by the ADC conversion. Such an amplifier arrangement is often used in the processing of audio signals. The audio signals may be delivered by a microphone such as a MEMS microphone.

A first feedback path may be configured to calibrate a time-invariant offset. The first feedback path includes a comparator coupled to the differential signal lines downstream the output of the differential amplifier. The comparator output controls one or more counters that generate a counting value representative of a correction voltage. The output of the one or more counters is digital-to-analog converted and fed back to at least one of the differential signal lines at the input side of the differential amplifier.

A second feedback path may be configured to calibrate a time-variant drift. An average filter coupled to the differential signal lines downstream the output side of the differential amplifier generates an average signal that is converted to a corresponding differential signal that is digital-to-analog converted and supplied to the differential signal lines at the input side of the differential amplifier.

The first feedback path may be operated first and the second feedback path is operated thereafter so that the drift to be calibrated by the second feedback path is substantially smaller than the initial offset. The second feedback path provides a fine-tuned calibration to bring the output of the differential amplifier as close as possible to the desired common mode voltage. The amplifier circuit arrangement according to the described embodiment is particularly useful for a signal path to process an audio signal.

The feedback paths may receive the input signals from the digital side of the wanted signal path, determine a correction value and feed it back to the analog side of the wanted signal path. At least one digital-to-analog converter is provided in the feedback paths to convert the digital correction value into an analog correction value that can be supplied to the analog differential signal lines at the input of the differential amplifier. At least one multiplexer is provided to combine the first and the second feedback paths. The multiplexer may be provided upstream of the analog-to-digital converter and downstream of the counters and the average filter of the first and second feedback paths, respectively. In practice, one multiplexer and one digital-to-analog converter are associated with each one of the differential signal lines at the analog input side of the differential amplifier.

The first feedback path may affect the signal on the positive or the negative analog differential signal line at the input side of the amplifier in response to the state of the output signal of the comparator. If the comparator determines that the signal on the positive differential signal line is lower than the signal on the negative differential signal line, the feedback loop affects or corrects the signal on the negative differential signal line at the input side of the amplifier. In the other case that the signal on the positive differential signal line is larger than the signal on the negative differential signal line determined by the comparator, the signal on the positive differential signal line at the input side of the amplifier is affected or corrected. The counter is operated as long as the comparator switches its state, that is that the signals on the positive and negative signal lines switch polarity. The correction value is increased until the comparator determines a change of polarity at the output of the amplifier. Then, the counter states are frozen and the second feedback loop is operated.

A mute circuit may be provided at the output of the sigma-delta ADC to inhibit a signal from being forwarded to the digital processing circuitry when the calibration process is ongoing. The mute circuit is active as long as the calibration process through the first and the second feedback paths is ongoing and before the calibration process is completed.

The overall circuit for the offset and drift calibration includes few additional components and can be operated during the use of the amplifier. A conventional tuning of the amplifier at the end of the production process that may require trimming of elements of the circuit is not necessary. The process operates digitally and supplies an analog correction value to the input side of the differential amplifier.

A circuit arrangement according to embodiments, in more detail, includes summing nodes in each of the differential signal lines at the input side of the differential amplifier to combine the wanted signal paths with the correction value. The comparator is coupled to the differential signal lines at the output side of the differential amplifier, which may be the output side of the anti-aliasing filter, if an AAS filter is present. The operation of first and second counters is controlled alternately by the output of the comparator. Further provided is an average filter combined with a lookup table. First and second multiplexers are provided to combine the outputs of the lookup table with the outputs of the first and second counters. First and second digital-to-analog converters are provided to supply the digital correction value from the multiplexers to the summing nodes.

In order to calibrate the amplifier to minimize offset and drift errors, first and second calibration processes are performed one after the other according to embodiments. According to the first calibration process, the differential signals at the output side of the differential amplifier are compared with each other and a correction value is provided to at least one of the differential signals at the input side of the differential amplifier. The correction signal is increased until the output signal of the comparator changes. Then, the second calibration process is performed in that the signal at the digital portion of the signal path, which is the output side of the sigma-delta ADC, is averaged during a predetermined length of an observation window. A correction signal is applied to at least one of the differential signals at the input side of the differential amplifier. In practice, a coding through a lookup table converts the correction value to a differential signal that can be applied to at least one of the differential signal lines at the input side of the differential amplifier.

In order to calibrate the offset, the sign of the differential signal on the signal lines at the output side of the differential amplifier is determined in that it is determined whether the positive signal line carries a lower signal than the negative signal line or vice versa according to further embodiments. In dependence on that determination, the correction signal is increased until the sign of the signal amplitude changes. The correction signal is applied to the negative signal line, if the signal on the positive signal line is lower than the signal on the negative signal line. In the other case, when the signal on the positive signal line is larger than the signal on the negative signal line, the correction value is applied to the positive signal line. The correction value is increased stepwise, for example, in a counter and the counting value is converted from the digital domain to an analog signal so that the applied correction value increases stepwise, for example, by 1 mV at each step. As a result, the output at the end of the offset correction process is supposed to be less than a correction step value, that is less than 1 mV. Then, the second calibration process to correct the amplifier drift is performed that comprises an averaging of the digital signal that is transformed to a corresponding differential voltage to be applied to the analog differential signal lines at the input side of the amplifier. This differential correction value is related to the determined average value or may be the size of the average value. Because the average value is single-ended and the correction value is differential, a corresponding coding is necessary, for example, performed through the lookup table.

The calibration of offset and drift may dynamically be performed during the operation of the amplifier. This means that after power on, first and second calibration processes for offset and drift are performed one after the other. During a sleep mode, the time-variant drift can be calibrated again, to take into account that the working conditions of the amplifier may have changed so that the drift may have changed. During the sleep mode, also called standby mode, there is no wanted signal at the input of the wanted signal path. In the embodiment of a microphone, there is substantially no signal provided by the microphone sensor to the amplifier during the sleep/standby mode period. The drift error of the amplifier can be re-calibrated without impact to the microphone operation. The mute circuit may be active so that calibration will not generate any errors in the downstream connected digital signal processing path. The drift calibration can be repeated every time a sleep/standby situation occurs. In a MEMS microphone system the drift calibration process does not add recognizable power consumption. It is to be noted that conventional systems that apply a trimming to calibrate the offset cannot perform such a dynamic re-calibration of the drift error, because trimming requires special test equipment.

As an advantage, the drift calibration can be repeated after expiry of a predetermined amount of time during normal operation of the amplifier, e.g., in the microphone system. This requires that the function of the microphone is interrupted during the time that the drift re-calibration process takes place in that, for example, the mute circuit is active. This time is relatively short so that it will not be recognized by a person using the microphone.

BRIEF DESCRIPTION OF THE DRAWINGS

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

In the drawings.

DETAILED DESCRIPTION OF ILLUSTRATIVE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
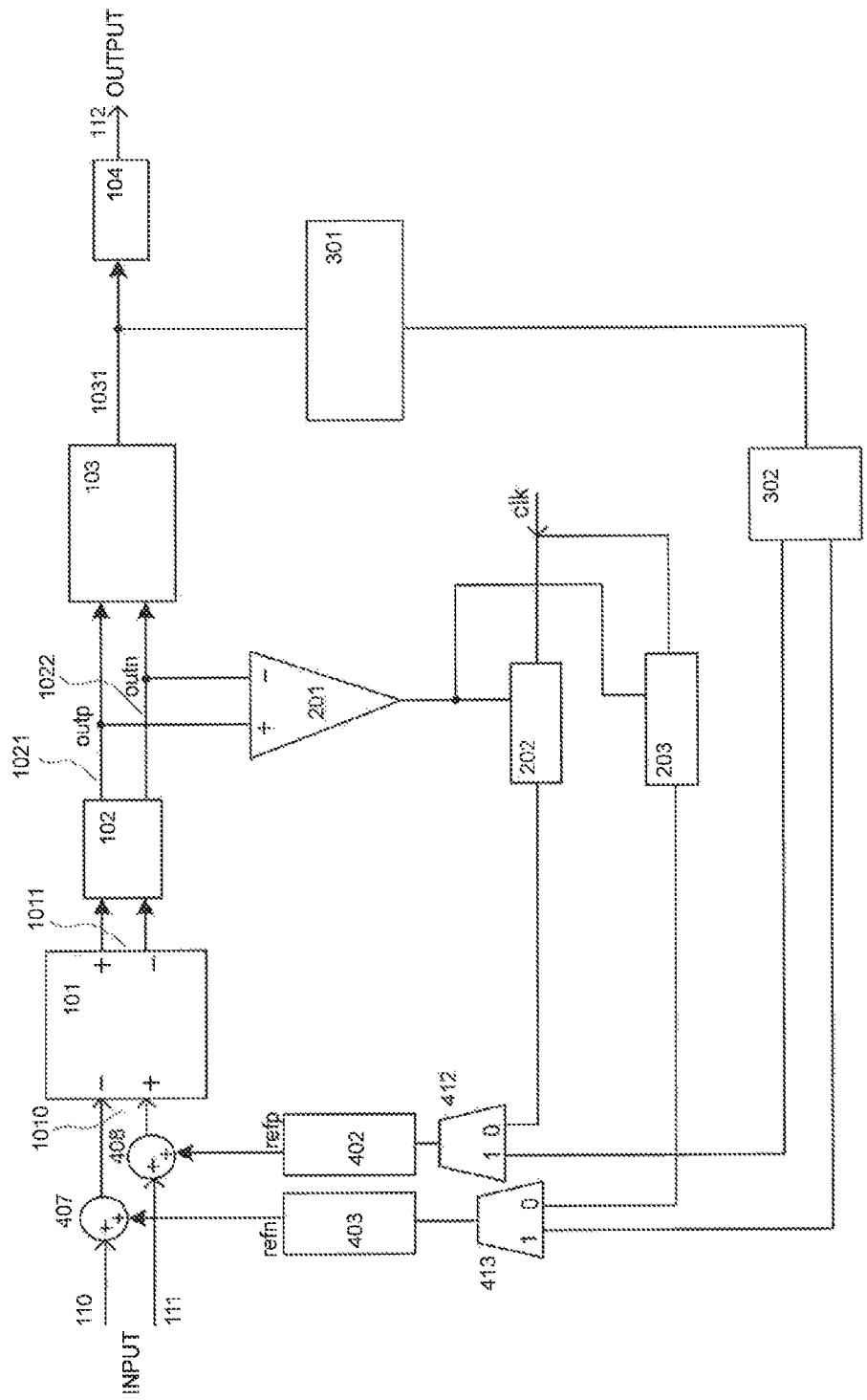
FIG. 1 shows a circuit diagram of an amplifier circuit arrangement.

FIG. 1 shows the schematic details of an amplifier circuit arrangement according to an embodiment. The amplifier circuit is configured to process audio signals and may be part of a MEMS microphone. The amplifier 101 is fully differential, having two input signals at terminals of the pair of differential signal lines at the input 1010 of the amplifier. Correspondingly, the output 1011 of amplifier 101 comprises a pair of positive and negative differential signal lines. The audio signal from the MEMS sensor is supplied as signal INPUT to differential signal lines 110, 111. An anti-aliasing filter (AAF) 102 is provided at the output of amplifier 101. The AAF 102 confines the analog signal bandwidth to avoid frequency spectrum aliasing by an analog-to-digital conversion performed downstream the signal path. The output signal lines 1021, 1022 carrying differential positive and negative output signals outp, outn are supplied to an analog-to-digital converter 103. The ADC 103 may be a sigma-delta-converter or sigma-delta-modulator as commonly used in audio signal processing. The output of ADC 103 is digital signal line 1031 which carries a digital audio signal. A mute circuit 104 is connected downstream of the ADC 103. The output 112 of mute circuit 104 carries digital output signal OUTPUT which may be supplied to further digital signal processing circuitry such as a digital signal processor (not shown). The described signal path from signals INPUT to OUTPUT from differential input signal lines 110, 111 to digital output line 112 processes the wanted signal which may be an audio signal in the present embodiment. The amplifier 101 may be a fixed gain amplifier or a variable gain amplifier (VGA) which has a variable amplification factor as often used in audio signal processing.

The amplifier 101 has an offset so that the output signal is different from the common mode signal level even if there is no input signal INPUT. The offset is caused by manufacturing variations and process mismatch. For example, for a fully differential circuit design, variations in the production process lead to a mismatch of the transistors in the different differential paths. An offset at the input side of the amplifier 101 may be in the range of 5 mV to 50 mV so that the output offset is considerably higher due to the gain of the amplifier. The offset output voltage is a time-invariant DC voltage error.

Usually, there is a time-variant voltage error called drift caused by the cross-sensitivity of some error sources due to temperature or time. One error source may be flicker noise from defects in the interface between the gate oxide and the silicon substrate of the CMOS transistors. Other possible drift error sources may be the temperature dependency of bias currents or noises of the supply voltage. The drift voltage error is usually a low frequency error in the range of 0 to 20 Hz that represents a considerable DC component. Offset and drift cause a shift of the amplifier output signal from the defined common mode output voltage of, for example, VDD/2 so that the amplitude of the differential wanted signal is limited. If the amplitude is too large, the signal may stick to ground potential or supply voltage VDD so that the information in the signal gets lost.

The circuit of FIG. 1 shows the first feedback path 201, 202, 203, 412, 413, 402, 403, 408, 407 that corrects the offset of the amplifier. The circuit includes the second feedback path 301, 302, 412, 413, 402, 403, 408, 407 that corrects the drift error. Multiplexers 412, 413 combine both circuit paths together. In state "0", the multiplexers enable the first feedback path, in state "1" the multiplexers enable the second feedback path.

Turning now to the offset feedback path, comparator 201 is connected to signal lines 1021, 1022 that carry differential output signals outp, outn. Comparator 201 determines the sign of differential signal outp, outn, whether outp is larger than outn or outp is smaller than outn. If the comparator output is "0", that is outp<outn, counter 202 is operated The output of counter 202 is forwarded to digital-to-analog converter (DAC) 402 that generates a correction signal refp which is forwarded to summing node 408 to increase the input signal at the positive (+) line of the input 1010 of amplifier 101. If the differential signals outp, outn have the other sign, that is outp>outn, the output of comparator 201 is "1" so that counter 203 is operated. The counting value from counter 203 is forwarded to DAC 403 to generate correction signal refn that is forwarded to summing node 407 to increase the signal at the negative (−) line of the input 1010 of amplifier 101.

Figure 2:
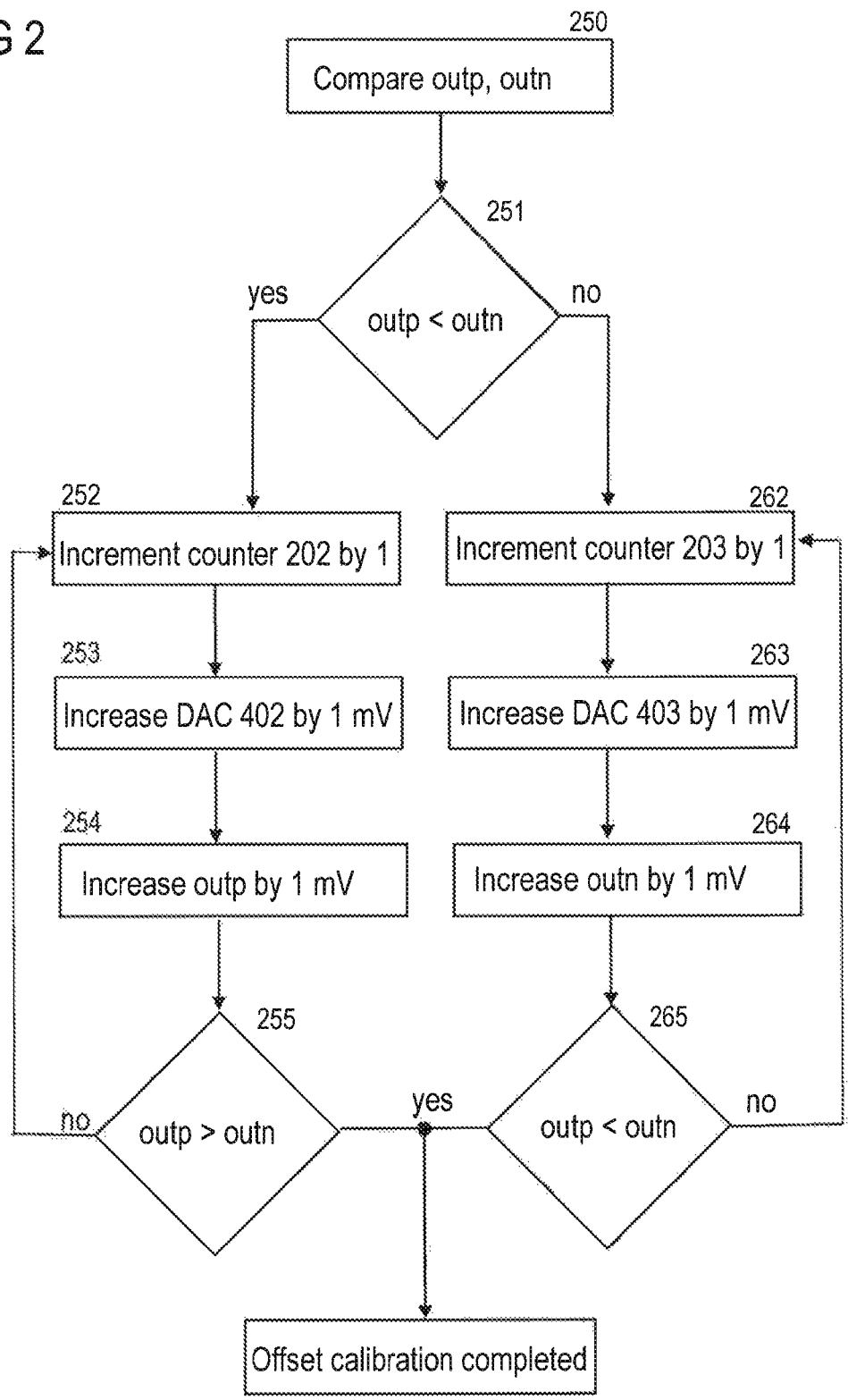
FIG. 2 shows a flowchart of the process to calibrate the offset.

Turning now to FIG. 2, the operation of the offset calibration loop is explained in more detail. At step 250, the signals outp, outn at the output side of amplifier 101 are compared by comparator 201. If outp<outn (step 251), counter 202 is incremented by 1 (step 252). The output of DAC 402 is incremented by a voltage step, e.g., 1 mV (step 253) so that the correction signal refp is incremented by a corresponding voltage step, e.g., 1 mV and the output signal of the amplifier outp is increased by a corresponding voltage step, e.g., 1 mV (step 254). The up-counting process is continued and the signal outn is continued to be reduced until the sign of the differential signal at lines 1021, 1022 changes in that outp>outn (step 255). In this case the calibration process will stop and it is assumed that the absolute offset outp-outn is about or lower than 1 mV.

In the other case that outp>outn (step 251), counter 203 is enabled by comparator 201 and up-counted by 1 (step 262). This increases the correction signal refn at DAC 403 by a voltage step, e.g., 1 mV (step 263). The output signal outn of amplifier 101 is increased by a corresponding voltage step, e.g., 1 mV (step 264). This process is continued as long as outp>outn and the counter 203 is up-counted and the signal outn is increased by increments of 1 mV. If the differential output signal of amplifier 101 change its sign, that is outp<outn, the calibration process is stopped so that it can be assumed that the absolute offset at the output of amplifier 101 is about or less than 1 mV. In the present example, the increments of counters 202, 203 correspond to a step size of 1 mV. Other values are also possible. At the end of the calibration process, the value of counters 202, 203 are frozen so that they hold during operation of the amplifier until the next offset calibration takes place.

Figure 3:
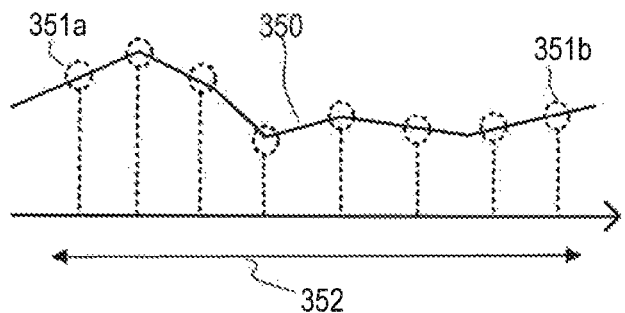
FIG. 3 shows an example of the drift of the amplifier circuit arrangement.

Concerning the drift calibration feedback loop, reference is made to FIGS. 1 and 3. FIG. 3 depicts the drift error at signal line 1031 at the output terminal of sigma-delta-modulator 103 as a digital signal 350. Signal 350 is represented by several sample values 351a, 351b in digital decimal form. Circuit 301 performs an averaging of the drift signal within a predetermined time window such as observation window 352. Circuit 301 calculates the average value which may be the arithmetic average or another average of the drift signal sample values occurring in observation window 352. In the present example, the average filter 301 calculates the average value for eight consecutive sample values. The average value is converted to a differential value to be forwarded to the input "1" of multiplexers 412, 413 so that the DACs 402, 403 generate a differential correction value refp, refn representative of the average value generated by circuit 301. In order to generate such a differential value from the single average value of averaging circuit 301, a lookup table 302 is provided that includes a corresponding relation between average value and differential correction value stored in a read only memory (ROM).

It is possible to supply the correction value to both correction signals refp, refn or only one of the correction signals refp, refn. The window size 352 can be varied depending on the desired accuracy. An increase of the observation window 352 requires the averaging over a larger number of samples so that the accuracy of the drift correction is increased. The averaging filter 301 may have adjustable filter coefficients depending on the desired accuracy. The window size and the number of sample points used by the average filter 301 can be adjusted by adjustable filter coefficients in dependence on the system requirements and the required drift correction accuracy.

The offset correction results in a residual error of, for example, less than 1 mV. The thereafter performed drift correction reduces this error further so that the residual error after offset and drift calibration is close to zero or substantially zero. In this case, the common mode output voltage of amplifier 101 is substantially the half of the supply voltage, i.e., VDD/2.

During the offset calibration and the drift calibration, mute circuit 104 is active in that the output signal OUTPUT is zero so that no audible glitch is forwarded to the downstream connected DSP circuits.

The described circuits for the offset correction feedback loop and the drift correction feedback loop operate in the digital domain such as comparator 201, counters 202, 203, averaging circuit 301 and lookup table 302. The generated correction values at the output of counters 202, 203 and lookup table 302 are forwarded to the DACs 402, 403 so that they can be supplied to the input side of the amplifier 101. These circuits can operate during normal operation of the amplifier system and therefore account for any errors that arise even during operation of the system. Compared to conventional trimming solutions, there is no need to perform a trimming of the circuit after production so that the expensive calibration and test procedures during the production process are saved.

Figure 4:
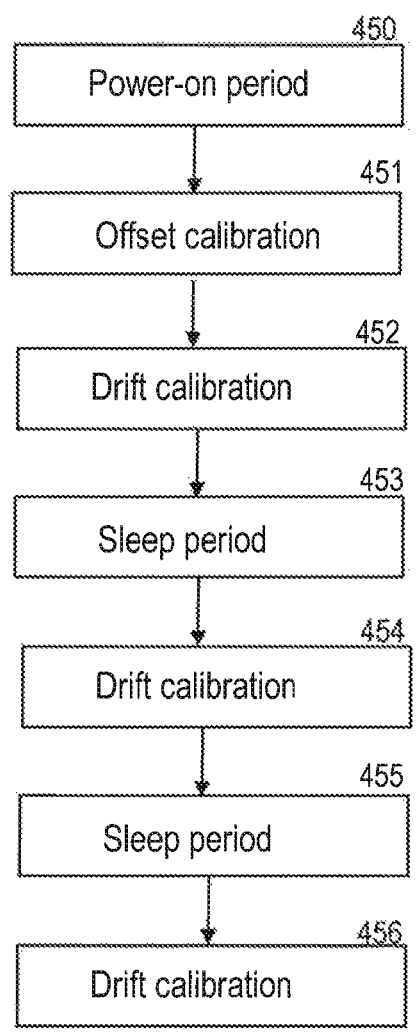
FIG. 4 shows a diagram representing the operation of an amplifier circuit arrangement.

Turning now to FIG. 4, after power on of the circuit, offset calibration is performed as shown in steps 450, 451. Thereafter, drift calibration is performed as shown in step 452. Whenever the amplifier circuit enters a sleep mode as shown in steps 453, 455, that is that the input signal INPUT at terminals 110, 111 of the wanted signal path is zero, a drift calibration is performed as shown in steps 454, 456. This reduces the time-variant drift that may have changed over the preceding operation period. The power consumption to perform the drift calibration is relatively low. In the case of a MEMS microphone that includes the circuit of FIG. 1, the drift calculation may add more current consumption to the sleep mode of the audio circuit, however, this is justified by higher accuracy of the circuit in that the residual drift is reduced by the repetitive performance of a drift calibration such as steps 454, 456 at every sleep period such as 453, 455.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirt and substance of the disclosure may occur to the persons skilled in the art, the disclosure should be construed to include everything within the scope of the appended claims.

What is claimed is:

1. An amplifier circuit arrangement comprising:
  a desired signal path comprising a differential amplifier for an analog signal having an input side and an output side and an analog-to-digital converter having an output terminal;
  a first feedback path to calibrate an offset of the desired signal path coupled to differential signal lines at the output side of the differential amplifier and to differential signal lines at the input side of the differential amplifier, the first feedback path comprising a comparator and at least one counter controlled by an output of the comparator; and
  a second feedback path to calibrate a drift of the desired signal path coupled to the output terminal of the analog-to-digital converter and to the differential signal lines at the input side of the differential amplifier, the second feedback path comprising an average filter.

2. The amplifier circuit arrangement of claim 1, further comprising at least one digital-to-analog converter connected downstream of the at least one counter and downstream of the average filter.

3. The amplifier circuit arrangement of claim 2, further comprising at least one multiplexer having an input terminal coupled to the output of the at least one counter and another input terminal coupled downstream of the average filter and having an output terminal coupled to the at least one digital-to-analog converter.

4. The amplifier circuit arrangement of claim 1, further comprising one of a coder and a lookup table connected downstream of the average filter.

5. The amplifier circuit arrangement of claim 1, wherein the first feedback path is configured to affect a signal on one of the differential signal lines at the input side of the differential amplifier in response to a state of an output signal of the comparator and to affect the signal on the other one of the differential signal lines at the input side of the differential amplifier in response to another state of an output signal of the comparator.

6. The amplifier circuit arrangement of claim 1, further comprising a mute circuit having an output terminal and an input terminal, the input terminal coupled to the output terminal of the analog-to-digital converter, the mute circuit configured to inhibit an output signal at the output terminal before calibration through at least one of the first and second feedback paths is completed.

7. The amplifier circuit arrangement of claim 1, further comprising:
   a summing node in each of the differential signal lines at the input side of the differential amplifier;
   input terminals of the comparator coupled to the differential signal lines at the output side of the differential amplifier;
   another counter controlled by the output terminal of the comparator;
   a first and a second multiplexer, wherein output terminals of the at least one counter and the other counter are connected to a respective input terminal of the multiplexers;
   a first and a second digital-to-analog converter, wherein output terminals of the first and second multiplexers are connected to input terminals of the first and second digital-to-analog converters and wherein output terminals of the first and second digital-to-analog converters are connected to a respective one of the summing nodes; and
   a lookup table, an output terminal of the average filter connected to an input terminal of the lookup table and output terminals of the lookup table connected to other input terminals of the first and second multiplexers.

8. A method for calibrating an amplifier circuit arrangement, the amplifier circuit arrangement comprising a desired signal path comprising a differential amplifier for an analog signal having an input side and an output side and an analog-to-digital converter having an output terminal, the method comprising:
   performing a first calibration process comprising comparing differential signals at the output side of the differential amplifier;
   applying a correction signal to at least one of the differential signals at the input side of the differential amplifier;
   changing the correction signal until the output signal of a comparator changes; and
   performing a second calibration process comprising averaging a signal at the output terminal of the analog-to-digital converter and applying a correction signal to at least one of the differential signals at the input side of the differential amplifier.

9. The method according to claim 8, wherein performing the first calibration process comprises when one of the differential signals at the output side of the differential amplifier has a lower amplitude than the other one of the differential signals at the output side of the differential amplifier, increasing the correction signal until the one of the differential signals is determined to have a larger amplitude than the other one of the differential signals.

10. The method according to claim 9, wherein the amplifier circuit arrangement comprises positive and negative differential signal lines at the input side of the differential amplifier and positive and negative signal lines at the output side of the differential amplifier, wherein the first calibration process comprises when the signal at the positive differential signal line at the output side of the differential amplifier has a lower amplitude than the signal at the negative differential signal line at the output side of the differential amplifier, increasing the correction signal and applying the correction signal to the positive signal line at the input side of the differential amplifier to increase the signal on the positive signal line at the input side until the signal on the positive signal line at the output side has a larger amplitude than the signal at the negative signal line at the output side.

11. The method according to claim 9, wherein the amplifier circuit arrangement comprises positive and negative differential signal lines at the input side of the differential amplifier and positive and negative signal lines at the output side of the differential amplifier, wherein the first calibration process comprises when the signal at the positive differential signal line at the output side of the differential amplifier has a larger amplitude than the signal at the negative differential signal line at the output side of the differential amplifier, then increasing the correction signal and applying the correction signal to the negative signal line at the input side of the differential amplifier to increase the signal on the negative signal line at the input side until the signal on the positive signal line at the output side has a lower amplitude than the signal at the negative signal line at the output side.

12. The method according to claim 8, wherein the second calibration process comprises:
   converting a signal level obtained by averaging a signal at the output terminal of the analog-to-digital converter to a differential correction signal having the signal level; and
   applying the differential correction signal to the differential signals at the input side of the differential amplifier.

13. The method according to claim 8, further comprising inhibiting an output signal of the analog-to-digital converter while performing the at least one of the first and second calibration processes.

14. The method according to claim 8, further comprising repeating the second calibration process during an operational period of the amplifier circuit arrangement when the desired signal path receives no desired signal or when the differential amplifier is in a standby mode or a sleep mode.

* * * * *